United States Patent
Kuhn et al.

[19]

[11] Patent Number: 5,892,425
[45] Date of Patent: Apr. 6, 1999

[54] INTERWOUND CENTER-TAPPED SPIRAL INDUCTOR

[75] Inventors: William B. Kuhn, Manhattan, Kans.; Aicha-Elshabini Riad; William F. Stephenson, both of Blacksburg, Va.

[73] Assignee: Virginia Tech Intellectual Properties, Inc., Blacksburg, Va.

[21] Appl. No.: 827,682

[22] Filed: Apr. 10, 1997

[51] Int. Cl.[6] ............................... H01F 5/00; H01F 27/28
[52] U.S. Cl. ......................... 336/200; 336/223; 336/232
[58] Field of Search .................................. 336/200, 232, 336/223

[56] References Cited

U.S. PATENT DOCUMENTS

| | | | |
|---|---|---|---|
| 4,369,557 | 1/1983 | Vandebult | 336/200 |
| 5,095,357 | 3/1992 | Andoh et al. | 336/200 |
| 5,359,315 | 10/1994 | Inoue et al. | 336/200 |
| 5,477,204 | 12/1995 | Li | 336/232 |

FOREIGN PATENT DOCUMENTS 3-82106-A   4/1991   Japan ...................................... 336/200

OTHER PUBLICATIONS

George D. Vendelin, Microwave Circuit Design Using Linear and Nonlinear Techniques, 1990, p. 736 and p. 741.

Kuhn et al, "Center–tapped Spiral Inductors for Monolithic Bandpass Filters", Dradley dept. of EE, Virginia Polytechnic Institute and State University, Blacksburg VA –IEEE (Electronic Letters On–line No. 19950411), Feb. 1995.

Primary Examiner—Michael L. Gellner
Assistant Examiner—Anh Mai
Attorney, Agent, or Firm—Whitham, Curtis & Whitham

[57] ABSTRACT

An inter-wound spiral center tapped inductor includes a first and second spiral inductor trace arranged in a plane in an inter-nested pattern with a center tap connection. The interwound traces implement the two halves of a center-tapped inductor over a common area to provide a practical inductor element for use in balanced and differential circuits.

14 Claims, 7 Drawing Sheets

INTERWOUND CENTER-TAPPED SPIRAL INDUCTOR

BACKGROUND OF THE INVENTION

1. Field of the Invention

This invention relates to spiral inductors and more particularly to a structure of, and a method for forming, spiral inductors on a semiconductor substrate. Spiral inductors relate to analog high frequency electronic circuits within, but not limited to, receiver and transmitter portions of wireless telecommunications devices such as cellular telephones, pagers, and Personal Communications Services (PCS) products.

2. Description of the Related Art

There are various geometries and structures existing in the art relevant to spiral inductors. These structures, however, have shortcomings in their electrical performance, cost, and/or physical size.

One type of conventional spiral inductor, illustrated in FIG. 1, is commonly implemented using an integrated circuit (IC) process over an insulating, semi-insulating, or semi-conducting substrate, having an optional ground plane.

For the design of balanced circuits, however, two inductor elements are needed, as illustrated in FIG. 2, items L1 and L2. Therefore, using the conventional art, two separate FIG. 1 inductors are needed, which consumes significant physical area. Further, because of a potential mismatch in inductance, the conventional separate inductors have potential problems with circuit balance. Still further, this conventional arrangement lowers the operating frequency range of the inductors, since one terminal of each inductor is at AC ground potential.

Other methods of implementing inductors are described by Jamison et al., "Inductively Coupled Push-Pull Amplifiers For Low Cost Monolithic Microwave ICs", 1982 GaAs Symposium, (Jamison '82), and Selmi, et al., "Design of an X-Band Transformer-Coupled Amplifier Circuit With Improved Stability and Control", IEEE Journal Of Solid State Circuits, Vol. 28, No. 6, June 1993, (Selmi '93).

Jamison '82 and Selmi '93, however, are inter-wound primary-secondary coils of coupling transformers and do not comprise inter-wound halves of a center-tapped inductor. This can be seen referring to Jamison '82 where the FIG. 1 schematic shows a left primary and a right secondary coil, each appearing center-tapped in a schematic sense because of their common point of electrical connection. However, looking to FIG. 2 of Jamison 82, the schematic's depicted center-tap of both the left inductor pair and the right inductor pair are physically the connection of two separated independent inductors. The interwound traces comprise the top half of the left (primary) pair interwound with the top half of the right (secondary) pair. Selmi '93 shows a similar arrangement of inter-wound primary and secondary traces. Hence, what is depicted as a center tapped inductor in both Jamison '82 and Selmi '93 consumes separate, and hence substantial, area for the two halves.

SUMMARY OF THE INVENTION

The present invention comprises a three-terminal center-tapped inductor implemented in a novel geometry by a pair of inter-wound spiral conductors co-arranged on an insulating, semi-insulating, or semi-conducting substrate.

The two inter-wound spiral conductors are formed by a respective pair of thin metal traces disposed on or within a substantially common plane. The plane can, for example, be one side of a hybrid substrate, or a PC board, or it can be a metal layer within an integrated circuit (IC). When the structure is constructed in an IC process the metal traces are formed over an insulating layer disposed over a support comprising a semi-insulating or semi-conducting substrate. The novel geometry inter-wound conductors of the center-tapped inductor of this invention can, for example, be implemented in a planar (2-metal) process.

In one embodiment, at the common center of the two inter-wound spiral traces, one trace end is connected to the opposite trace at the outside of the spiral to form a center-tap terminal. The remaining trace end on the outside of the spiral together with the remaining trace end on the inside of the spiral form the two remaining terminals of the center-tapped inductor.

To obtain high magnetic coupling between the two inter-wound traces, metal ground planes are absent both above and below the traces. This differs from the conventional spiral designs typically encountered in GaAs IC processes, where metal ground planes are used. The metal ground planes of these conventional designs produce image currents, which lowers the magnetic coupling between turns and the overall inductance value.

The present invention, having no ground planes present, has a measured total inductance—measured from the free ends of the inductor with the center tap open circuited or grounded—approximately that of a traditional spiral in free space. This is approximately twice the value that would be obtained if the two interwound spirals were separated, as in the conventional art. Therefore, the present invention with its novel geometry of inter-wound spiral traces, increases the inductance, and hence the quality factor, achievable in a given area when compared to the use of two independent spirals in, for example, a differential circuit.

Accordingly, one of the benefits of the present invention relates to balanced circuits, which can be built with only one center-tapped inductor. The present invention implements a center-tapped inductor as a single physical circuit element, thereby consuming less area, in addition to providing good electrical balance by virtue of inter-turn coupling between the two inductor halves. The present invention also doubles the operating frequency range, since the design behaves as a floating device with respect to differentially excited AC signals at each end. Other described embodiments of the present invention are the inter-wound inductor within balanced circuits.

These and other objectives of the invention are a solution, not available in the conventional related art, to the need for a center-tapped inductor circuit element implementable in a planar geometry.

DESCRIPTION OF THE PREFERRED EMBODIMENTS

First Embodiment

The present invention will be described in reference to a first embodiment of the novel interwound spiral center-tapped inductor structure. Further embodiments comprising additional and varied structures will then be described. To the extent that the further embodiments have structure common with the first embodiment, the description of that first embodiment will not be re-stated.

Figure 3B:
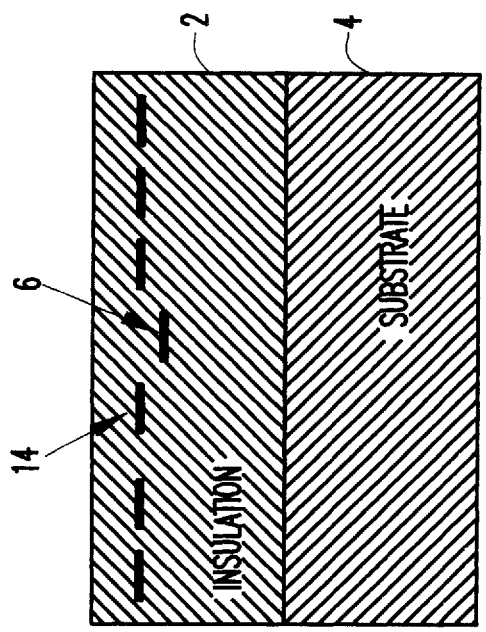
FIG. 3B is a cross-sectional side view of the first embodiment shown as of FIG. 3A.
Figure 3A:
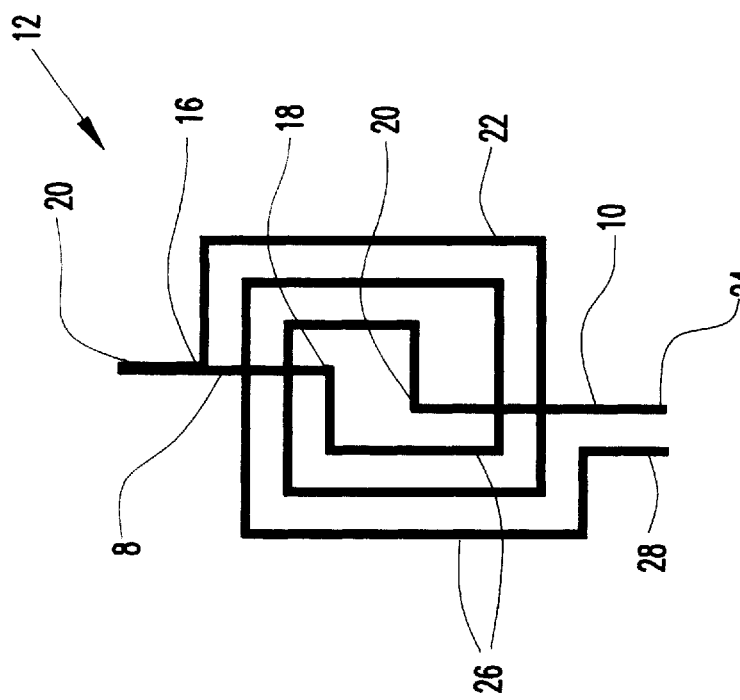
FIG. 3A is an elevation view of a first embodiment of the present invention.
Figure 4:
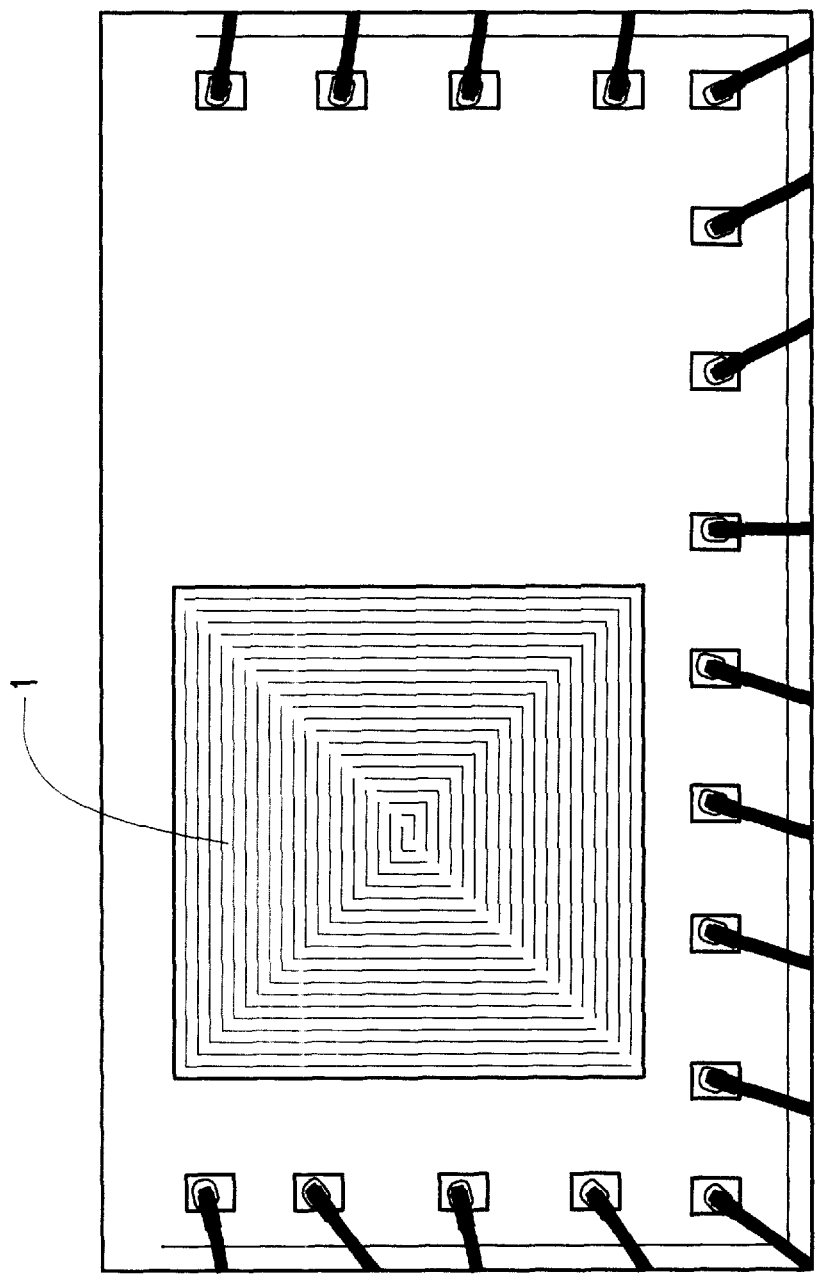
FIG. 4 is an elevation view of a CMOS implementation of a spiral inductor according to the present invention.

Referring now to FIGS. 3A, 3B and 4, the spiral inductor of this embodiment will be described. This embodiment will be described in reference, where appropriate, to a constructed example unit which is shown, in simplified form, as item 1 in FIG. 4. The constructed example had a design inductance of 250 nH and was built in a 2-metal, 2 um silicon CMOS IC process. Accordingly, certain of the example parameter values were chosen in view of the 250 nH design inductance. However, upon reading the description and drawings, one of skill in the art can readily select parameter values to implement the present invention according to the desired inductance.

Referring now to FIGS. 3A, 3B, the inductor 1 of this embodiment is formed by depositing an insulating layer 2 on, for example a silicon substrate 4. The constructed example was implemented over an N-well (not shown) in substrate 4 having a 1.5 um insulation layer 2 formed of silicon dioxide. However, the thickness is not critical and other compositions of the insulation layer 2 can be used according to the particular selected IC process. The N-well (not shown) in the substrate 4 of the constructed example was AC grounded around its outside perimeter (not shown) using an N-well contact ring (not shown) tied to a positive supply voltage, broken at one corner to prevent eddy current losses. The pad ring (not shown) and other potential metal loops (not shown) on the host chip are also broken to minimize losses.

Referring to FIG. 3B, a first metal interconnect layer 6 is deposited over the insulating layer 4. The first metal layer 6 of the constructed example had a thickness of approximately 0.5 um. The specific thickness of the layer 6 is not critical, but instead is process-dependent. The first metal interconnect layer 6 comprises cross-connect traces 8 and 10 shown in FIG. 3A. A second insulating layer (not numbered) overlays the first metal layer 6. The inter-wound spiral trace according to the pattern shown as 12 on FIG. 3A is then disposed in the second metal layer 14. Referring to FIG. 4, the constructed example of this embodiment implemented trace 12 as 26 turns, occupying an outer dimension of 850 um. Turn pitch was 16 um and trace width was 12 um. The close spacing of spiral trace 12 is used to obtain high magnetic coupling and mutual inductance. Further, the spacing is inversely proportional to the number of spiral turns in the pattern and therefore drives, in part, the inductance value. Conversely, due to a capacitance between the spiral traces, an overly close spacing will increase capacitance effects, which are discussed further below.

The pattern of FIG. 3A is shown as a substantially rectangular spiral. Alternatively, the spiral could be circular, hexagonal or octagonal and could have elliptical symmetry. The rectangular form was selected for the constructed example because of pattern design constraints within the specific chip layout tools used.

The thickness of the second metal layer 14 of the constructed example was 1.2 um. The thickness is not critical except for the general objective of low resistance within an inductor. For example, 2 um layer 14 would likely improve the performance, in terms of resistive loss, compared to 1.2 um.

Vias (not shown) are formed at points 16, 18, and 19. The vias at points 16 and 18 connect, via trace 8, two respective ends of the interwound spiral trace 12 into a centertap connection terminating at 20. Referring to FIG. 3A, it can be seen that this connection forms a first spiral loop, or inductor half, 22, extending from point 24 of the first metal layer trace 10 through the via at point 19 to the centertap connection 20, and a second spiral loop, or inductor half, 26, which is inter-wound with the first loop 22, and extends from point 28 of the trace 12 to the centertap connection 20 through first metal layer trace 8.

The example constructed by the present inventors used the top-most metal layer 14 for the trace 12 because that layer possessed the lowest series resistance, making it preferable for the main inductor traces. The constructed example employed the higher resistance bottom layer 6 for the crossover traces 8 and 10. Use of the top metal layer 14 for the main traces 22 and 26 also provides the lowest turn-to-substrate capacitances, maximizing the self-resonant frequency.

The described inter-wound geometry yields two substantially balanced inductors in approximately one-half the area achievable by conventional methods. More specifically, the inductance is given by the empirical formula: $L \approx 8.5 \times D \times N^{1.8}$, where L is the inductance in nH, D is the outer dimension in centimeters, and N is the total number of spiral turns. When the two ends of the inductor of the present invention are excited differentially, the effective inductance, from each end to the center tap, is half this value. This is approximately twice the value that would be obtained if the two interwound spirals were separated, as in the conventional art, since the number of turns in each would then be one-half the total N and hence L for each would be decreased by a factor of approximately 4.

To better ensure high magnetic coupling between the two interwound traces, metal ground planes are absent above and below the inductor turns.

According to standard design practice for high frequency circuits, including balanced or differential circuits within silicon ICs, the spiral traces 22 and 26 of FIG. 3A are best fabricated in the thickest practicable metallization layer. As described above, the thickest metallization layer for the 2 layer CMOS technology used for of the constructed example is the top-most layer 14. Greater thickness results in a greater inductor quality factor, which relates to the ratio of inductive reactance to series resistance.

However, even with the present invention's improved performance relative to similar traditional spiral designs, the capacitance between the spiral turns, such as 22 and 26, and the underlying semiconducting substrate, such as 4, may limit the maximum usable frequency and reduce the inductor quality factor. To minimize these inductor losses, the resistivity of the substrate 4 is kept small by using an appropriate doping type (well, N+, or P+doping). As described above, the constructed example used an N well substrate.

Figure 5:
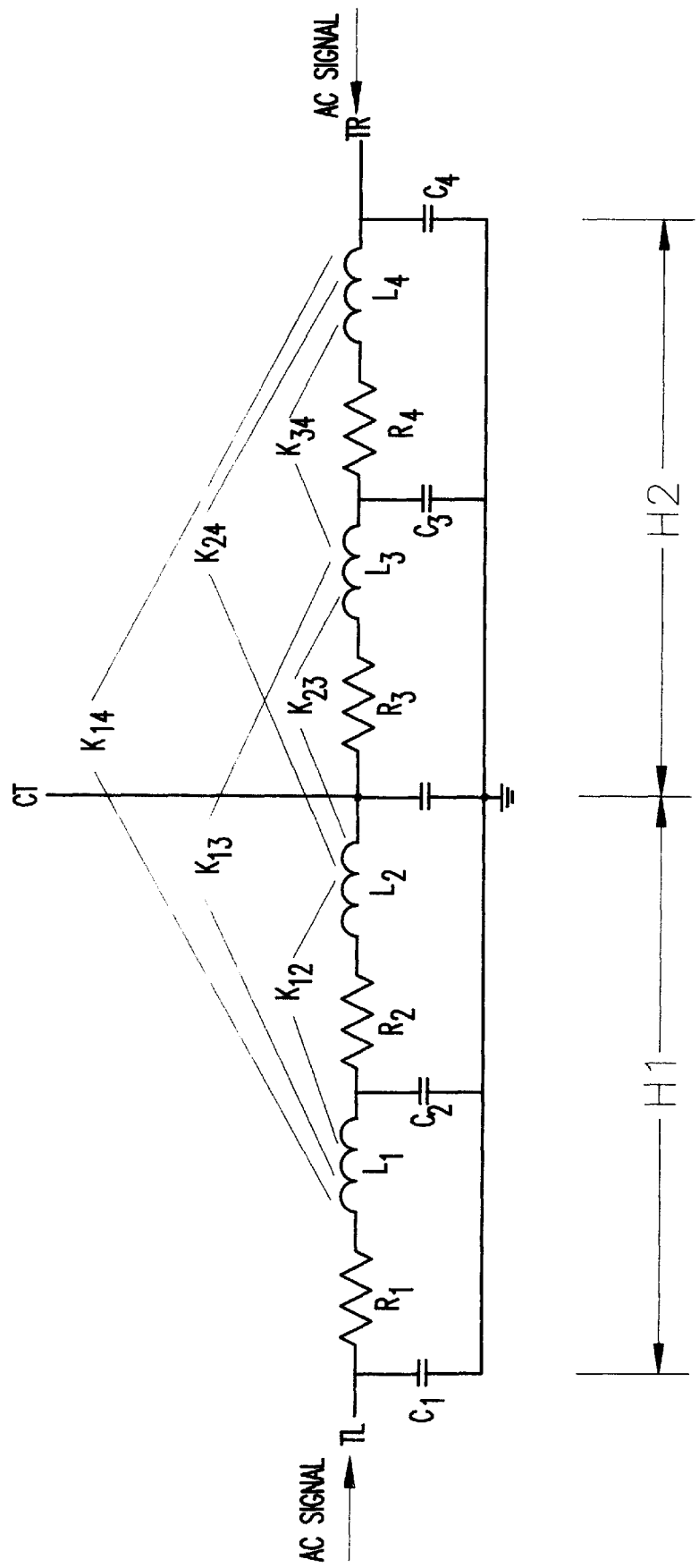
FIG. 5 depicts a lumped parameter model of a center tapped inductor according to the present invention.

The turn-to-substrate capacitances, together with the self and mutual inductances of the individual spiral turns (not numbered) within the traces 22 and 26, determine the maximum usable, or self-resonant, frequency. Accordingly, upon selecting a maximum usable frequency, a lumped parameter model of this embodiment will readily enable one of ordinary skill to select the structural parameters to attain the desired result. An example lumped parameter model, which can be easily constructed by one of ordinary skill, is shown in FIG. 5. As is known in the art, FIG. 5 model forms a lumped element approximation to a transmission line, with mutual coupling to other segments of the line, which can be analyzed or simulated to determine the present inductor's maximum usable frequency or, conversely, the parameter values needed to attain a predetermined frequency.

Referring now to FIG. 5, a model of a four turn case of an inductor arranged according to FIG. 3A is shown, where $L_j$ is the self-inductance of the j'th turn, $R_j$ is the series resistance of the j'th turn, $K_{ij}$ represents the coupling coefficient between the ith and jth turns, $C_j$ represents the turn-to-substrate capacitance of the jth turn. The connection points 24 and 28 of FIG. 3A correspond to TL and TR of the FIG. 5 model, and the regions H1 and H2 correspond to the inductor halves 22 and 26 shown in FIG. 3A. Likewise, the FIG. 5 point CT corresponds to the center tap 20 of FIG. 3A.

Figure 2:
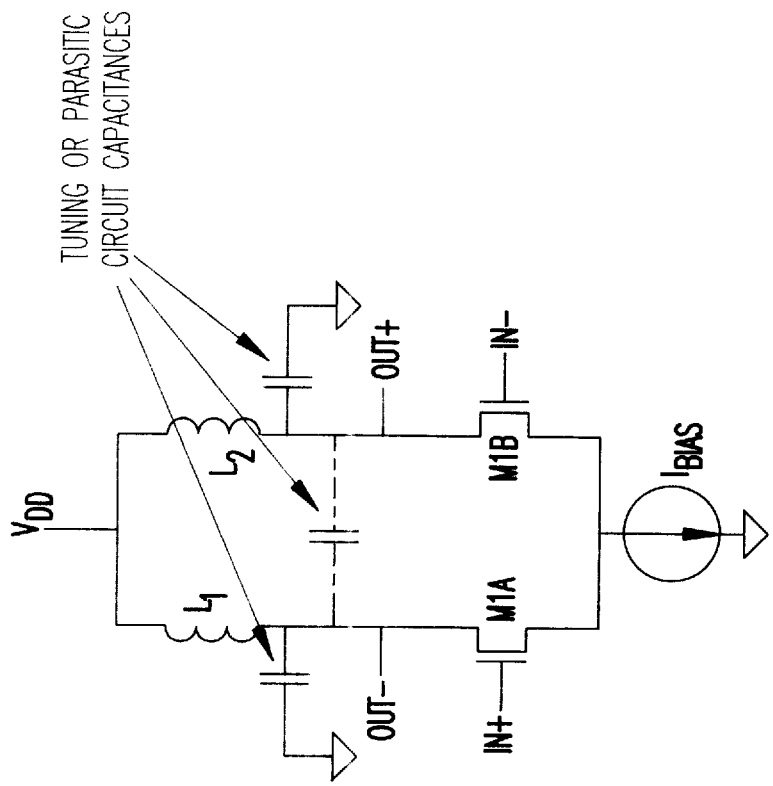
FIG. 2 is schematic illustration of a differential amplifier employing conventional separate inductors.
Figure 1:
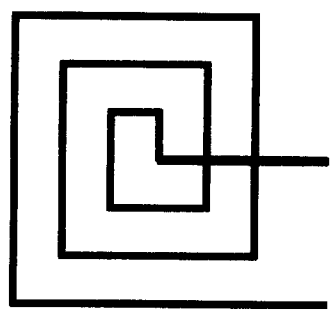
FIG. 1 depicts a conventional spiral inductor geometry.

It can be seen by one of skill in the art that with the center-tapped inductor of FIGS. 3A and 3B excited at points 24 and 28 by differential (out-of-phase) sources, the maximum usable frequency is twice that of a traditional spiral of the same dimensions and total inductance having one end grounded. This occurs because the center-tap point and differential excitation forms a virtual ground half way down the line. Hence, the frequency at which the shorted transmission line appears as an open circuit at the feedpoint (the self-resonant frequency) is doubled relative to a single inductor of FIG. 1 with one end grounded.

Second Embodiment

Figure 6:
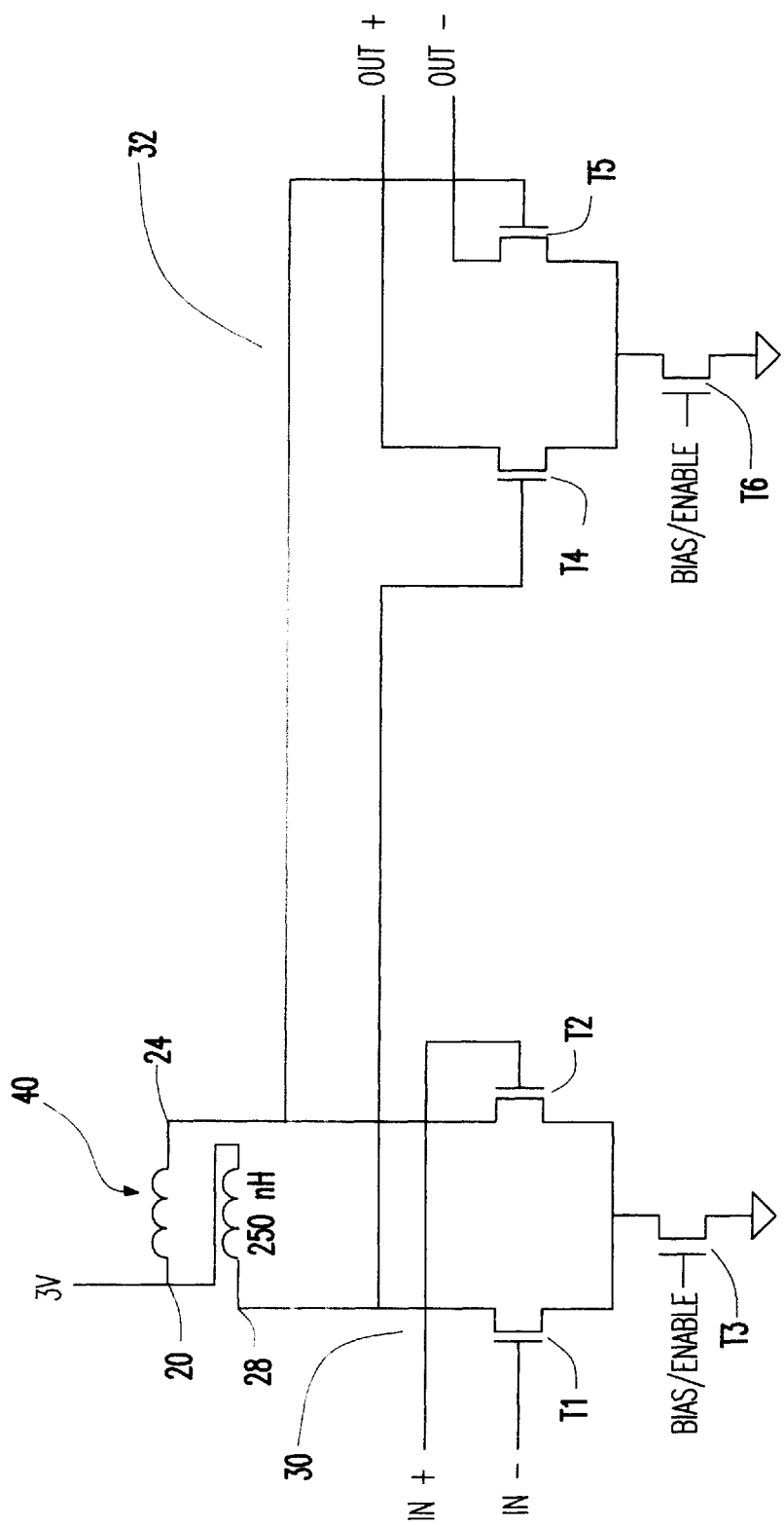
FIG. 6 shows a differential amplifier of the second embodiment having an output transconductor circuit.

Referring now to FIG. 6, the inductor of the first embodiment is shown, in schematic form, within a conventional differential amplifier 30 and in a further circuit having an additional differential output buffer circuit 32. The differential transconductor input circuit 30 comprises, for this example, NMOS transistors T1–T3 and differential output transconductor circuit 32 comprises, for this example, NMOS transistors T4–T6. For this example the width/length ratios (in um) of transistors T1–T6 were selected as 72/2 for T1, T2, T4 and T5 and 144/2 for the bias/enable transistors T3 and T6. Other width/length ratios could be used depending on the desired circuit gain.

In this embodiment, the inductor 40 is the inductor of the first embodiment connected to function as a tuned-circuit load for the differential amplifier 30, thereby resonating out the capacitances of connected circuits 30 and 32, and allowing high gain to be achieved with good common-mode rejection due to coupling between the two inductor halves 22 and 26.

An example circuit built according to the IC process described in the first embodiment exhibited a Q of approximately 2.2 at 200 MHZ, giving a bandwidth of approximately 100 MHZ. Compared to the conventional circuits of this type using two separate spiral inductors, the higher self-resonant frequency of the present invention's interwound spiral inductor 40 both extends the frequency range of the circuit's operation and, by using a single physical inductor, substantially reduces die size.

Third Embodiment

Figure 7:
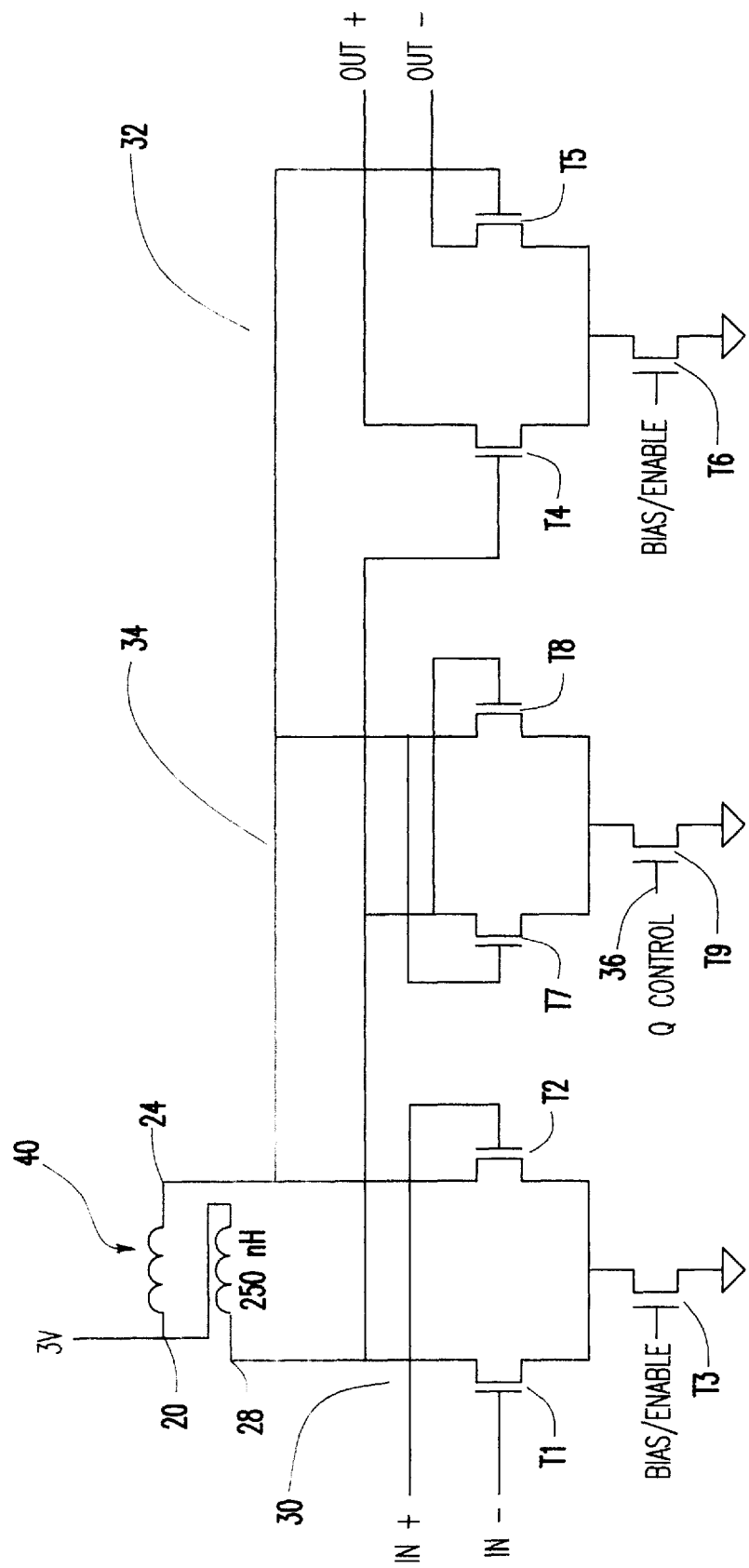
FIG. 7 shows a third embodiment, having the differential amplifier of FIG. 6 with a negative resistance circuit.

Referring to FIG. 7, this embodiment combines the differential amplifier of FIG. 6 with a cross-coupled differential amplifier 34, or transconductor, which forms a negative resistance. The cross-coupled differential amplifier 34 comprises, for this example, NMOS transistors T7–T9. The voltage at terminal 36 of T9 is the Q control and is varied by an external DC source in accordance with known engineering practice to achieve a desired effective Q within the tuned circuit comprising center tapped inductor 40 and associated resonating capacitances of the inductor and connected circuits 30, 32, and 34. In accordance with standard engineering design practice the width/length ratio (in um) of T7 and T8 is 144/2, while that of the Q control transistor T9 is 288/2. This negative resistance cancels the losses of inductor 40 and raises the effective Q of the inductor and surrounding circuitry from 2.2 to any desired value up to infinity (oscillation), as the voltage at node 36 is increased. A constructed example of this embodiment, using the IC process described for the first embodiment, and having a Q setting of 100, yielded a 2 MHZ bandwidth filter operating at 200 MHZ. The improved performance of the center-tapped inductor provides higher base inductor Q at the selected operating frequency than could be achieved using two non-center-tapped inductors of the same total physical area, resulting in better dynamic range and lower power consumption within the circuit.

Fourth Embodiment

Figure 8:
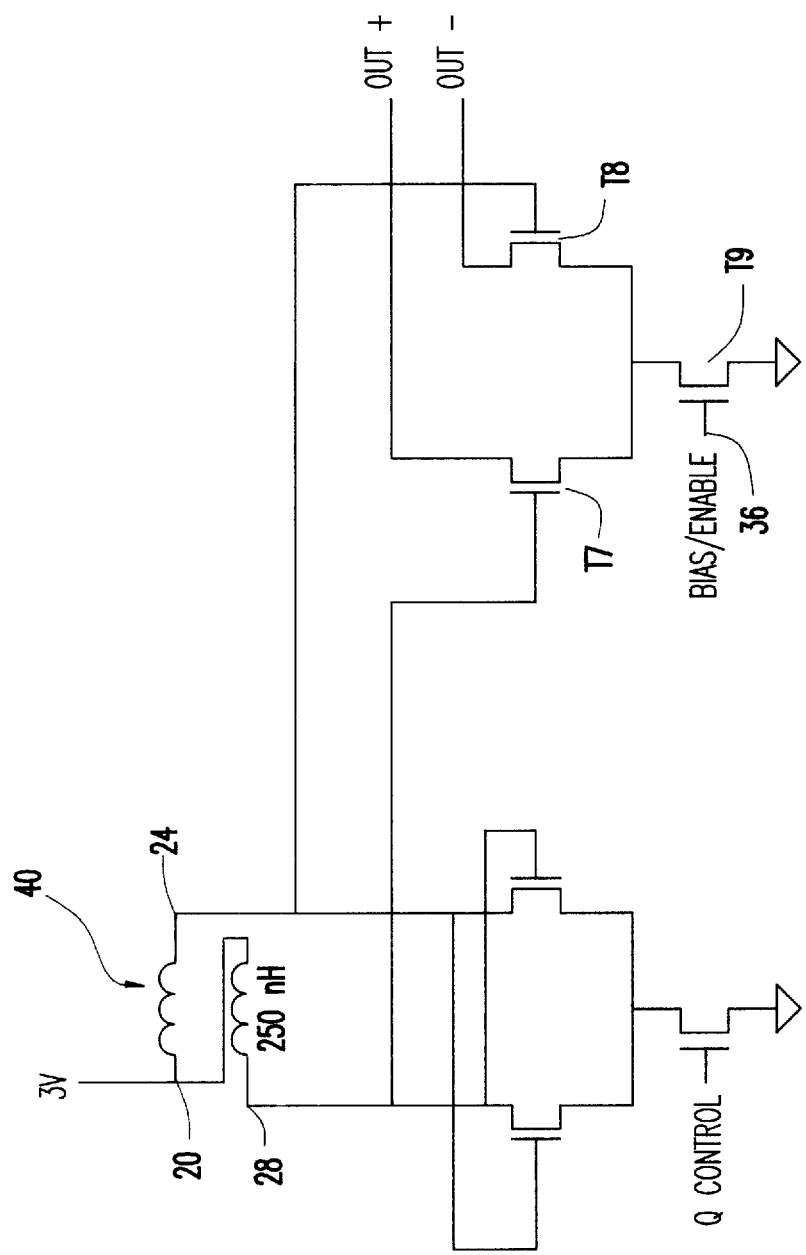
FIG. 8 shows a fourth embodiment of the invention, having a variation of FIG. 7 to embody an RF oscillator.

Referring now to FIG. 8, this embodiment comprises an RF oscillator implemented, for this example, by removing or isolating the input buffer transconductor 30 from the circuit of FIG. 7 and setting the control voltage at terminal 36 of T9 to a value creating oscillation. A circuit according to FIG. 8 was constructed and oscillated at the 200 MHZ resonance frequency defined by the inductor and connected capacitances.

The improved performance of the center-tapped inductor 40 provides higher base inductor Q at the selected operating frequency, resulting in better phase noise performance and lower power consumption than achievable with two traditional spirals of the same total physical area It will now be apparent to those skilled in the art that other embodiments, improvements, details, and uses of the present invention can be made consistent with the letter and spirit of the foregoing disclosure. For example, referring to FIG. 3A, an air-bridging for cross-over of the cross-connects 8 and 10 instead of multiple metallization layers and through-vias. Accordingly, the scope and spirit of this patent is set by the following claims, construed in accordance with the patent law.

We claim:

1. An inductor comprising:
   a mounting structure having means for mounting a conductor in a plane;
   a first conductor, mounted in said plane by said means for mounting a conductor, extending from a first terminal to a second terminal and arranged in said plane in a first spiral pattern, said first spiral pattern having spiral loops;
   a second conductor, mounted coplanar with said first conductor in said plane by said means for mounting a conductor, extending from a third terminal to a fourth terminal and arranged in said plane according to a second spiral pattern, said second spiral pattern having spiral loops and being substantially identical to said first spiral pattern and located so that at least one of the spiral loops of said second conductor extends between the spiral loops of said first spiral pattern; and a centertap having means for connecting said second terminal to said fourth terminal.

2. The inductor of claim 1, wherein all of the spiral loops in said first spiral pattern and all of the spiral loops in said second spiral pattern travel in one of a clockwise direction and a counterclockwise direction.

3. The inductor of claim 2, wherein the spiral loops in said first spiral pattern are concentrically interleaved with the spiral loops in said second spiral pattern so that all loops of said inductor form a single concentric spiral shape traveling in said one of a clockwise direction and a counterclockwise direction.

4. The inductor of claim 2, wherein said first conductor and said second conductor are arranged in a geometry which includes one of a square, rectangle, circle, hexagon, octagon, and ellipse.

5. The inductor of claim 1, wherein said first terminal and said third terminal input differentially excited AC signals into said first conductor and said second conductor, respectively.

6. The inductor of claim 1, wherein said first conductor and said second conductor are mounted on said mounting structure without a metal ground plane disposed at least one of above and below said first conductor and said second conductor.

7. The inductor of claim 6, wherein said first conductor and said second conductor are mounted on said mounting structure without a metal ground plane above and below said first conductor and said second conductor.

8. A centertap inductor comprising:

a first spiral conductor and a second spiral conductor, said first and second spiral conductors arranged in a common plane on a mounting surface and arranged in a mutually nested spiral pattern;

a center connect terminal connected to a first end of each of said first and second spiral conductors;

a first terminal connected to a second end of said first spiral conductor; and a second terminal connected to a second end of said second spiral conductor.

9. The inductor of claim 8, wherein an entire length of said first spiral conductor and an entire length of said second spiral conductor travel in one of a clockwise direction and a counterclockwise direction.

10. The inductor of claim 9, wherein the entire length of said first spiral conductor and the entire length of said second spiral conductor are concentrically interleaved so that said mutually nested spiral pattern contains only one spiral pattern traveling in said one of a clockwise direction and a counterclockwise direction.

11. The inductor of claim 9, wherein said first spiral conductor and said second spiral conductor are arranged in a geometry which includes one of a square, rectangle, circle, hexagon, octagon, and ellipse.

12. The inductor of claim 8, wherein said first terminal and said second terminal input differentially excited AC signals into the second end of said first spiral conductor and the second end of said second spiral conductor, respectively.

13. The inductor of claim 8, wherein said first spiral conductor and said second spiral conductor are mounted on a mounting structure without a metal ground plane disposed at least one of above and below said first spiral conductor and said second spiral conductor.

14. The inductor of claim 13, wherein said first spiral conductor and said second spiral conductor are mounted on said mounting structure without a metal ground plane above and below said first conductor and said second conductor.

* * * * *